US012261131B2

(12) United States Patent
Matsushima et al.

(10) Patent No.: US 12,261,131 B2
(45) Date of Patent: Mar. 25, 2025

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Tsuneyuki Matsushima, Matsumoto (JP); Kazuhiro Kitahara, Matsumoto (JP); Naoko Kodama, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 513 days.

(21) Appl. No.: 17/746,934

(22) Filed: May 17, 2022

(65) Prior Publication Data

US 2023/0027894 A1   Jan. 26, 2023

(30) Foreign Application Priority Data

Jul. 21, 2021 (JP) ................. 2021-120973

(51) Int. Cl.
*H01L 23/00* (2006.01)
*H01L 21/78* (2006.01)
*H01L 23/544* (2006.01)
*H01L 23/58* (2006.01)

(52) U.S. Cl.
CPC ............ *H01L 23/562* (2013.01); *H01L 21/78* (2013.01); *H01L 23/544* (2013.01); *H01L 23/585* (2013.01); *H01L 2223/54426* (2013.01); *H01L 2223/5446* (2013.01)

(58) Field of Classification Search
CPC ..... H01L 23/562; H01L 21/78; H01L 23/544; H01L 23/585; H01L 2223/54426; H01L 2223/5446
See application file for complete search history.

(56) References Cited

U.S. PATENT DOCUMENTS

| 6,927,125 B2* | 8/2005 | Jones .................. H01L 27/0805 257/E27.048 |
| 2005/0082640 A1* | 4/2005 | Takei .................... H02M 7/003 257/E29.198 |
| 2007/0029641 A1 | 2/2007 | Hamatani |
| 2009/0242931 A1* | 10/2009 | Tsuzuki ................ H01L 29/167 257/143 |

FOREIGN PATENT DOCUMENTS

| CN | 107004697 A | * | 8/2017 | ......... H01L 27/1218 |
| JP | 2005101551 A | * | 4/2005 | ......... H01L 29/0696 |
| JP | 2007067372 A | | 3/2007 | |
| JP | 2007335483 A | | 12/2007 | |

* cited by examiner

*Primary Examiner* — Michael Lebentritt (57) ABSTRACT

Provided is a semiconductor device including: a semiconductor substrate provided with an active portion and an edge termination structure portion surrounding the active portion; an interlayer dielectric film provided above the semiconductor substrate; a protective film provided above the interlayer dielectric film; and a protruding portion provided farther from the active portion than the edge termination structure portion and protruding further than the interlayer dielectric film. The protruding portion is not covered with the protective film. The protective film is provided closer to the active portion than the protruding portion.

20 Claims, 12 Drawing Sheets

SEMICONDUCTOR DEVICE AND METHOD OF MANUFACTURING SEMICONDUCTOR DEVICE

The contents of the following Japanese patent application are incorporated herein by reference:
NO. 2021-120973 filed in JP on Jul. 21, 2021.

BACKGROUND

1. Technical Field

The present invention relates to a semiconductor device and a method of manufacturing the semiconductor device.

2. Related Art

In a conventional method of manufacturing a semiconductor device, dicing is performed on a scribe region which is a boundary region between semiconductor devices to form the semiconductor device into a chip. A technique for suppressing a decrease in yield due to damage during dicing is known (see, for example, Patent Documents 1 and 2).
Patent Document 1: Japanese Patent Publication Application No. 2007-67372
Patent Document 2: Japanese Patent Publication Application No. 2007-335483

DESCRIPTION OF EXEMPLARY EMBODIMENTS

Hereinafter, the present invention will be described through embodiments of the invention, but the following embodiments do not limit the invention according to the claims. Not all combinations of features described in the embodiments are essential to the solution of the invention. Note that, in the present specification and the drawings, elements having substantially the same function and configuration are denoted by the same reference numerals, and redundant description is omitted, and elements not directly related to the present invention are not illustrated. In one drawing, elements having the same function and configuration are representatively denoted by a reference numeral, and the reference numerals for the others may be omitted.

As used herein, one side in a direction parallel to a depth direction of a semiconductor substrate is referred to as "upper" and the other side is referred to as "lower". One of two main surfaces of a substrate, a layer or other member is referred to as an upper surface, and the other surface is referred to as a lower surface. "Upper" and "lower" directions are not limited to a direction of gravity, or a direction in which a semiconductor module is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. The Z axis direction described without positive or negative sign means a direction parallel to the +Z axis and the Z axis. In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. In the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error caused by a variation in manufacturing or the like is included. The error is, for example, within 10%.

Figure 1:
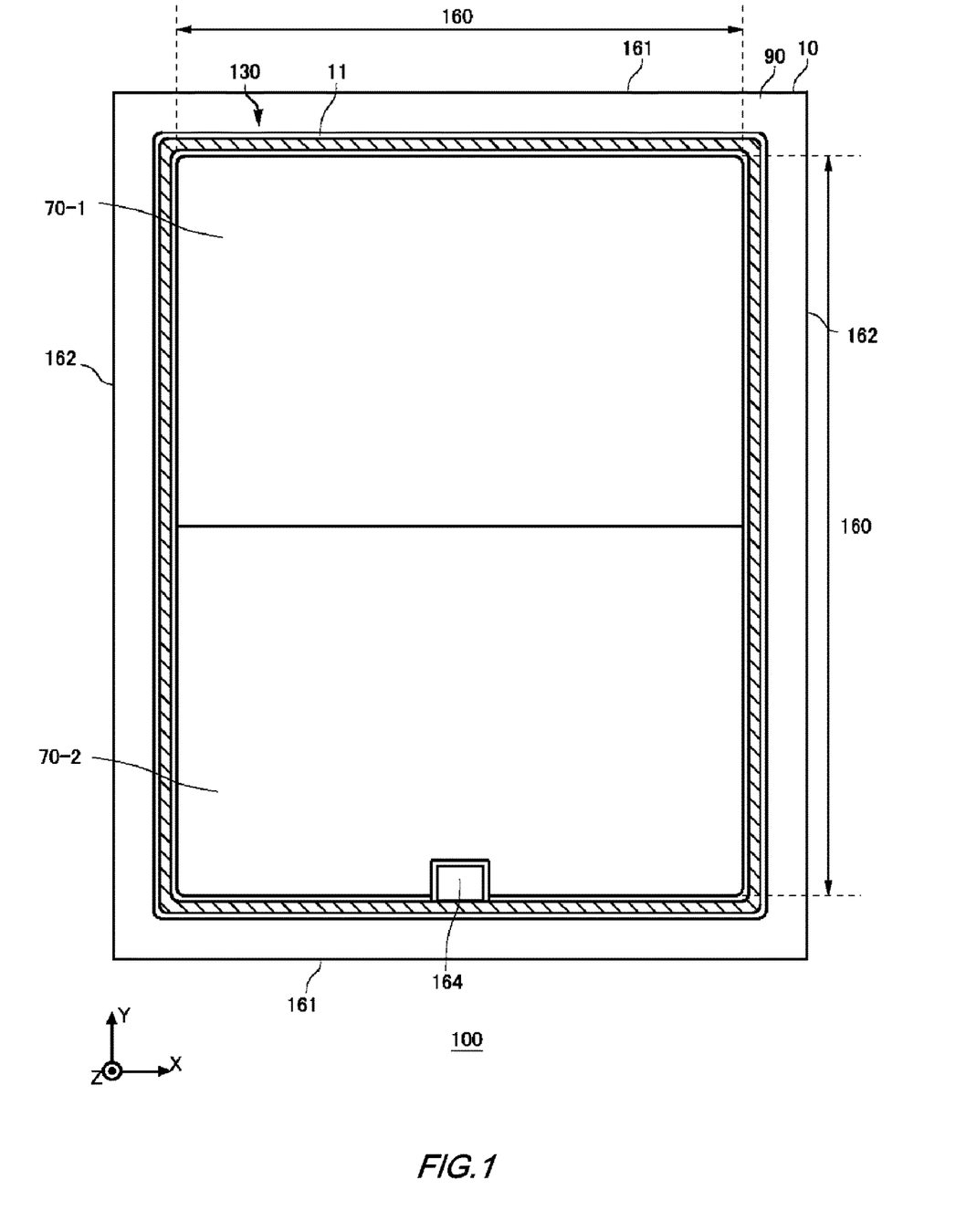
FIG. 1 is a top view illustrating a comparative example of a semiconductor device 100.

FIG. 1 is a top view illustrating a comparative example of a semiconductor device 100. FIG. 1 illustrates a position where each member is projected on the upper surface of a semiconductor substrate 10. In FIG. 1, only some members of the semiconductor device 100 are illustrated, and the remaining members are omitted. The semiconductor device 100 is a chipped semiconductor chip.

The semiconductor device 100 is provided on the semiconductor substrate 10. The semiconductor substrate 10 is a substrate formed of a semiconductor material. As an example, the semiconductor substrate 10 is a silicon substrate, but the material of the semiconductor substrate 10 is not limited to silicon.

The semiconductor substrate 10 has a first end side 161 and a second end side 162 in a top view. In the present specification, when simply referred to as a top view, it means viewing from the upper surface side of the semiconductor substrate 10. The semiconductor substrate 10 of the present example has two sets of first end sides 161 facing each other in a top view. In addition, the semiconductor substrate 10 of the present example has two sets of second end sides 162 facing each other in a top view. In FIG. 1, the first end side 161 is parallel to the X axis direction. The second end side 162 is parallel to the Y axis direction. The Z axis is perpendicular to the upper surface of the semiconductor substrate 10.

The semiconductor substrate 10 is provided with an active portion 160. The active portion 160 is a region through which a main current flows in the depth direction between the upper surface and the lower surface of the semiconductor substrate 10 when the semiconductor device 100 operates. An emitter electrode is provided above the active portion 160, but is omitted in FIG. 1.

In the present example, the active portion 160 is provided with a transistor portion 70 including a transistor element such as an IGBT. In another example, the transistor portion 70 and the diode portion including the diode element such as a free wheel diode (FWD) may be alternately disposed along a predetermined arrangement direction on the upper surface of the semiconductor substrate 10. The transistor portion 70 may be provided with a reverse blocking IGBT. In the present example, two transistor portions 70 (a transistor portion 70-1 and a transistor portion 70-2) are provided along the Y axis direction. A P+ type well region may be provided between the respective transistor portions 70. A gate runner formed of polysilicon or the like may be provided between the respective transistor portions 70.

The transistor portion 70 has a P+ type collector region in a region in contact with the lower surface of the semiconductor substrate 10. In the transistor portion 70, a gate structure including an N++ type emitter region, a P− type base region, a gate conductive portion, and a gate dielectric film is periodically disposed on the upper surface side of the semiconductor substrate 10.

The semiconductor device 100 may have one or more pads above the semiconductor substrate 10. The semiconductor device 100 of the present example includes a gate pad 164. The semiconductor device 100 may have pads such as an anode pad, a cathode pad, and a current detection pad. Each pad is disposed in the vicinity of the first end side 161. The vicinity of the first end side 161 refers to a region between the first end side 161 and the emitter electrode in a top view. At the time of mounting the semiconductor device 100, each pad may be connected to an external circuit via wiring such as a wire.

A gate potential is applied to the gate pad 164. The gate pad 164 is electrically connected to the conductive portion of the gate trench portion of the active portion 160. The semiconductor device 100 includes a gate runner 130 that connects the gate pad 164 and the gate trench portion. In FIG. 1, the gate runner 130 is hatched with oblique lines.

The gate runner 130 is disposed between the active portion 160 and the first end side 161 or the second end side 162 in a top view. The gate runner 130 of the present example surrounds the active portion 160 in a top view. A region surrounded by the gate runner 130 in a top view may be the active portion 160. The gate runner 130 is connected to the gate pad 164. The gate runner 130 is disposed above the semiconductor substrate 10. The gate runner 130 may be a metal wiring containing aluminum or the like.

The outer circumferential well region 11 is provided to overlap with the gate runner 130. That is, similarly to the gate runner 130, an outer circumferential well region 11 surrounds the active portion 160 in a top view. The outer circumferential well region 11 is also provided to extend with a predetermined width in a range not overlapping with the gate runner 130. The outer circumferential well region 11 is a region of the second conductivity type. The outer circumferential well region 11 of the present example is P+ type. The impurity concentration of the outer circumferential well region 11 may be $5.0 \times 10^{17}$ atoms/cm$^3$ or more and $5.0 \times 10^{19}$ atoms/cm$^3$ or less. The impurity concentration of the outer circumferential well region 11 may be $2.0 \times 10^{18}$ atoms/cm$^3$ or more and $2.0 \times 10^{19}$ atoms/cm$^3$ or less.

In addition, the semiconductor device 100 may be provided with a temperature sensing portion (not illustrated) which is a PN junction diode formed of polysilicon or the like, and a current detection portion (not illustrated) which simulates the operation of the transistor portion 70 provided in the active portion 160. The temperature sensing portion may be connected to the anode pad and the cathode pad via wiring. When the temperature sensing portion is provided, the temperature sensing portion is preferably provided at the center of the semiconductor substrate 10 in the X axis direction and the Y axis direction.

The semiconductor device 100 of the present example includes an edge termination structure portion 90 between the active portion 160 and the first end side 161 or the second end side 162 in a top view. The edge termination structure portion 90 is provided on the semiconductor substrate 10. The edge termination structure portion 90 of the present example is disposed between the outer circumferential gate runner 130 and the first end side 161 or the second end side 162. The edge termination structure portion 90 surrounds the active portion 160 in a top view. The edge termination structure portion 90 reduces electric field strength on the upper surface side of the semiconductor substrate 10. The edge termination structure portion 90 may include at least one of a guard ring, a field plate, and a RESURF annularly provided surrounding the active portion 160.

Figure 2:
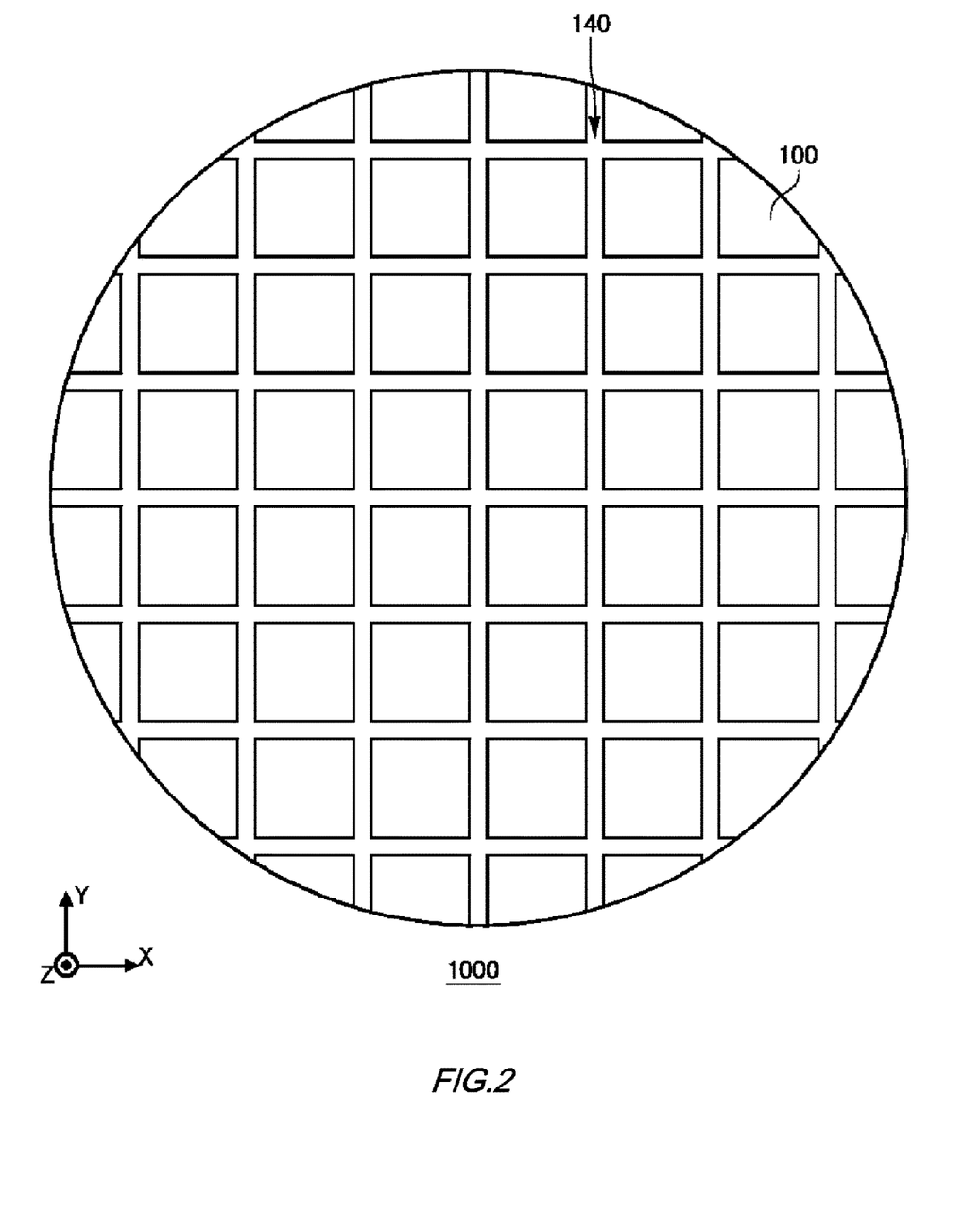
FIG. 2 is a diagram illustrating a wafer 1000 in a top view.

FIG. 2 is a diagram illustrating a wafer 1000 in a top view. The wafer 1000 includes a plurality of semiconductor devices 100. In the manufacture of the semiconductor device 100, the semiconductor device 100 is formed into a chip by dicing the wafer 1000. The wafer 1000 in the present example has a substantially circular shape in a top view. The wafer 1000 may be diced by a known dicing method. As an example, the wafer 1000 is diced by a dicing saw.

In the wafer 1000, a scribe region 140 is provided between the semiconductor devices 100. The scribe region 140 is a boundary region between the semiconductor devices 100. FIG. 2 schematically illustrates the semiconductor device 100 and the scribe region 140. Therefore, the dimensions in FIG. 2 do not match the actual dimensions. When the wafer 1000 is diced, the wafer 1000 may be diced with reference to the scribe region 140. That is, the wafer 1000 is diced along the scribe region 140. Note that a part of the scribe region 140 may remain in the semiconductor device 100 after dicing.

Figure 3:
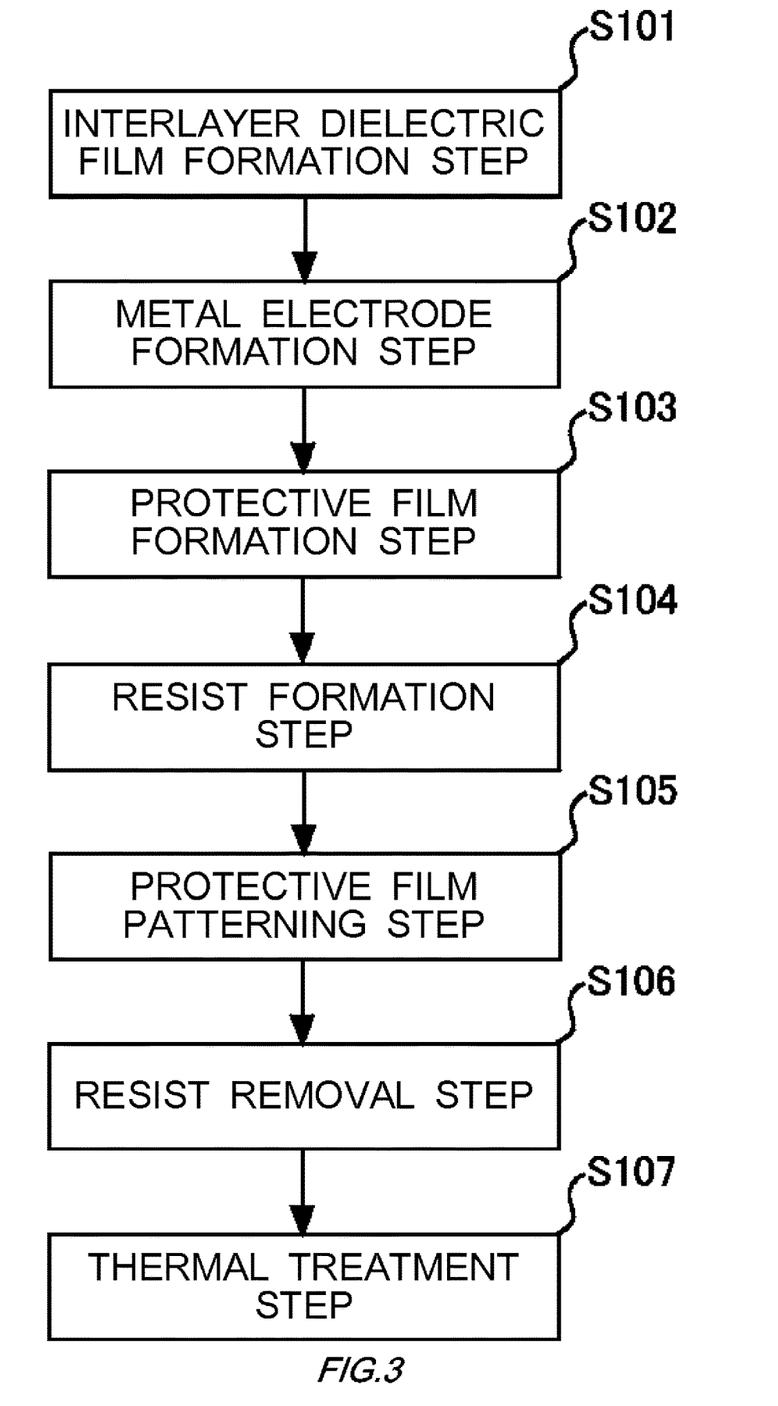
FIG. 3 is a diagram for explaining a flowchart of a comparative example of a method of manufacturing the semiconductor device 100.

FIG. 3 is a diagram for explaining a flowchart of a comparative example of the method of manufacturing the semiconductor device 100. The method of manufacturing the semiconductor device 100 includes an interlayer dielectric film formation step S101, a metal electrode formation step S102, a protective film formation step S103, a resist formation step S104, a protective film patterning step S105, a resist removal step S106, and a thermal treatment step S107. First, the comparative example of the method of manufacturing the semiconductor device 100 will be described.

Figure 4:
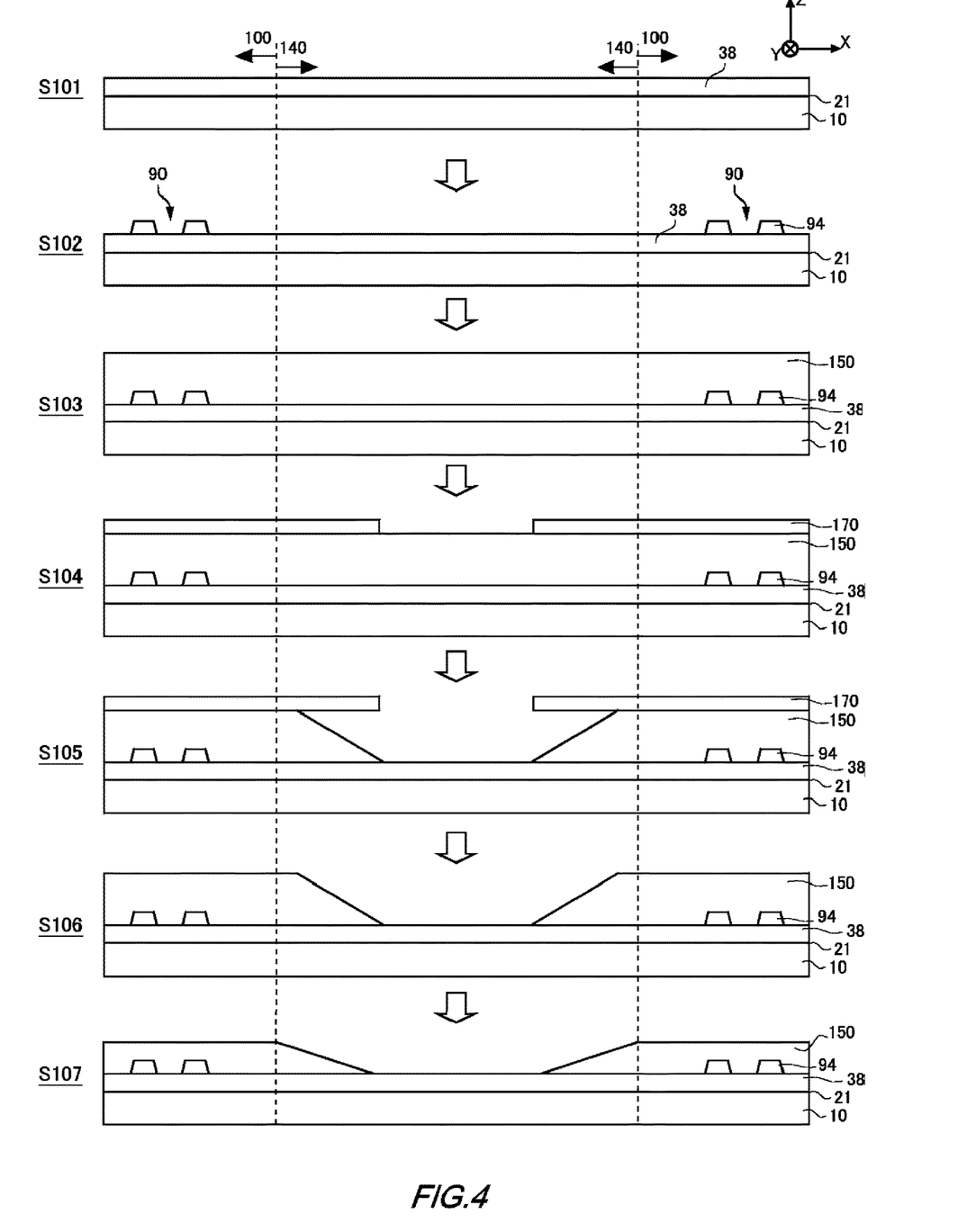
FIG. 4 is a diagram for explaining a comparative example of the method of manufacturing the semiconductor device 100 in the vicinity of a scribe region 140.

FIG. 4 is a diagram for explaining the comparative example of the method of manufacturing the semiconductor device 100 in the vicinity of the scribe region 140. FIG. 4 illustrates a cross section of the scribe region 140 and the semiconductor device 100. In FIG. 4, the boundary between the semiconductor device 100 and the scribe region 140 is indicated by a dotted line.

In the interlayer dielectric film formation step S101, an interlayer dielectric film 38 is formed above the semiconductor substrate 10. In the present example, the interlayer dielectric film 38 is formed on the upper surface 21 of the semiconductor substrate 10. The interlayer dielectric film 38 is a film including at least one of a dielectric film such as silicate glass to which an impurity such as boron or phosphorus is added, a thermal oxide film, and other dielectric films. In the present example, the interlayer dielectric film 38 is a borophosphosilicate glass (BPSG) film. The interlayer dielectric film 38 may also be provided above the semiconductor substrate 10 in the active portion 160.

In the metal electrode formation step S102, a metal electrode 94 is formed above the interlayer dielectric film 38. The metal electrode 94 may be provided in the edge termination structure portion 90. The metal electrode 94 may be a field plate provided in the edge termination structure portion 90. The metal electrode 94 may be connected to a guard ring (not illustrated). The metal electrode 94 is of AlSi as an example.

In the protective film formation step S103, a protective film 150 is formed above the interlayer dielectric film 38. As an example, the protective film 150 is a protective film that becomes a polyimide film by performing the thermal treatment step S107. The protective film 150 may be a polyimide film in the protective film formation step S103. That is, the thermal treatment may be performed in the protective film formation step S103. By providing the protective film 150, the semiconductor substrate 10 and the interlayer dielectric film 38 can be protected. The protective film 150 may be provided on the entire semiconductor substrate 10 (wafer 1000).

In the resist formation step S104, a resist 170 is formed above the protective film 150. The resist 170 may be in contact with the upper surface of the protective film 150. The resist 170 may be patterned. By providing the resist 170, the protective film 150 can be patterned using the resist 170 in the protective film patterning step S105. The resist 170 is a photosensitive resist as an example. The protective film 150 is a non-photosensitive polyimide as an example.

In the protective film patterning step S105, the protective film 150 is patterned. The protective film 150 may be patterned by a known etching method. In the present example, the protective film 150 is patterned by wet etching. Note that the protective film 150 may be patterned in the same process as the patterning of the resist 170.

In the resist removal step S106, the resist 170 is removed. The resist 170 may be removed by a chemical solution. The chemical solution used in the resist removal step S106 may be an organic solvent.

In the thermal treatment step S107, the wafer 1000 is subjected to thermal treatment. A polyimide film is formed by performing the thermal treatment step S107. The thermal treatment step S107 may be performed by a known method. The thermal treatment step S107 is performed by a thermal annealing furnace as an example.

In the thermal treatment step S107 of FIG. 4, the protective film 150 is also formed in the scribe region 140. In this case, when dicing is performed along the scribe region 140, the protective film 150 may be damaged, which may cause a decrease in yield or a defect. Therefore, the semiconductor device 100 is preferably designed such that the protective film 150 is not formed in the scribe region 140. However, due to variations in patterning of the protective film 150 caused by wet etching, it is necessary to set the semiconductor device 100 to have a complicated layer structure with a design margin, and it is difficult to design the protective film 150 not to be formed in the scribe region 140.

Figure 5:
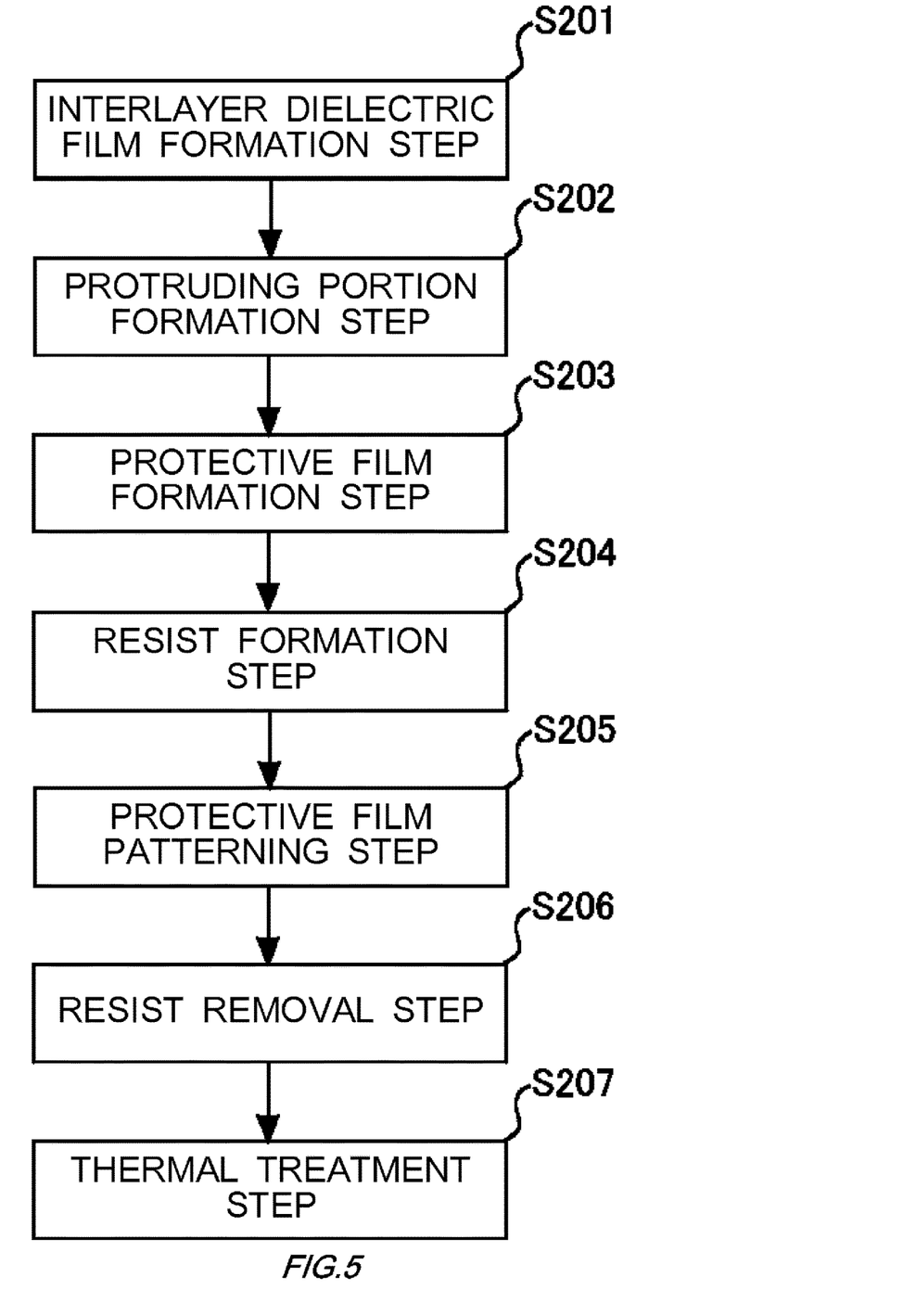
FIG. 5 is a diagram for explaining a flowchart of an exemplary embodiment of the method of manufacturing the semiconductor device 100.

FIG. 5 is a diagram for explaining a flowchart of an exemplary embodiment of the method of manufacturing the semiconductor device 100. The method of manufacturing the semiconductor device 100 includes an interlayer dielectric film formation step S201, a protruding portion formation step S202, a protective film formation step S203, a resist formation step S204, a protective film patterning step S205, a resist removal step S206, and a thermal treatment step S207. Next, an exemplary embodiment of the method of manufacturing the semiconductor device 100 will be described.

Figure 6:
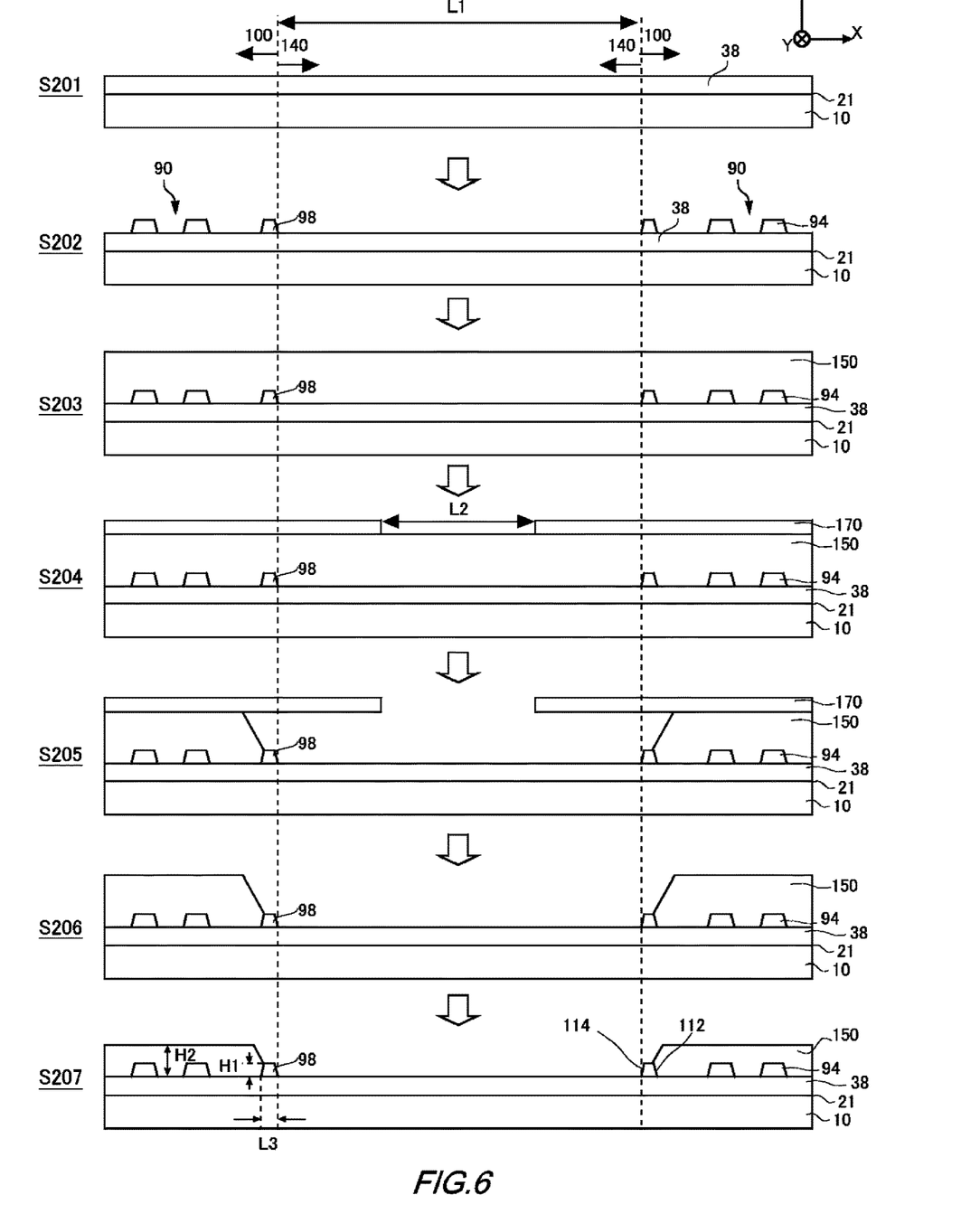
FIG. 6 is a diagram for explaining an exemplary embodiment of the method of manufacturing the semiconductor device 100 in the vicinity of the scribe region 140.

FIG. 6 is a diagram for explaining an exemplary embodiment of the method of manufacturing the semiconductor device 100 in the vicinity of the scribe region 140. FIG. 6 illustrates a cross section of the scribe region 140 and the semiconductor device 100. In FIG. 6, the boundary between the semiconductor device 100 and the scribe region 140 is indicated by a dotted line. The interlayer dielectric film formation step S201 may be the same as the interlayer dielectric film formation step S101 of FIG. 4.

In the protruding portion formation step S202, a protruding portion 98 is formed. The protruding portion 98 protrudes further than the interlayer dielectric film 38. The protruding portion 98 is provided in the semiconductor device 100. In addition, the protruding portion 98 may be provided farther from the active portion 160 than the edge termination structure portion 90. That is, the protruding portion 98 is provided closer to the scribe region 140 than the edge termination structure portion 90. The protruding portion 98 may be provided in an outer circumferential region described later. The protruding portion 98 may not be provided in the scribe region 140. The end portion of the protruding portion 98 may be provided closer to the active portion 160 than the boundary between the semiconductor device 100 and the scribe region 140. The end portion of the protruding portion 98 may be the boundary between the semiconductor device 100 and the scribe region 140.

In the present example, the protruding portion 98 is a single-layer film. The protruding portion 98 may be a metal film. The protruding portion 98 is of AlSi as an example. In the protruding portion formation step S202, the metal electrode 94 may be formed above the interlayer dielectric film 38. Since the protruding portion 98 is a metal film, it can be formed in the same process as the metal electrode 94.

The protective film formation step S203, the resist formation step S204, the protective film patterning step S205, the resist removal step S206, and the thermal treatment step S207 may be the same as the protective film formation step S103, the resist formation step S104, the protective film patterning step S105, the resist removal step S106, and the thermal treatment step S107 of FIG. 4 except that the protruding portion 98 is formed.

After the protective film patterning step S205, the protruding portion 98 is not covered with the protective film 150. The protective film 150 is provided closer to the active portion 160 than the protruding portion 98. That is, the protective film 150 is not formed in the scribe region 140. In the present example, since the protruding portion 98 protruding further than the interlayer dielectric film 38 is provided on the scribe region 140 side of the semiconductor device 100, it is possible to prevent the protective film 150 from being formed in the scribe region 140. Therefore, damage at the time of dicing can be suppressed.

The patterning of the protruding portion 98 has smaller variations than the patterning of the protective film 150.

Therefore, since the position where the protruding portion 98 is formed is less likely to vary and the protective film 150 is less likely to be formed in the scribe region 140, damage at the time of dicing can be suppressed with a simple layer structure.

The protruding portion 98 is provided at a position lower than the upper end of the protective film 150 in the height direction. That is, the height H1 of the protruding portion 98 (see the thermal treatment step S207) is smaller than the height H2 of the protective film 150 (see the thermal treatment step S207). The height H1 of the protruding portion 98 may be the maximum height of the protruding portion 98. The height H2 of the protective film 150 may be the maximum height of the protective film 150. The height H2 of the protective film 150 may be 3 times or more the height H1 of the protruding portion 98. By providing the protruding portion 98 at a position lower than the upper end of the protective film 150 in the height direction, flatness of the semiconductor device 100 can be secured. The height H1 of the protruding portion 98 is about 5 μm as an example.

The width L3 (see the thermal treatment step S207) of the protruding portion 98 may be 4.5 μm or more. The width L3 of the protruding portion 98 may be a width in a direction from the semiconductor device 100 toward the scribe region 140 (the X axis direction in FIG. 6). The width L3 of the protruding portion 98 may be 6.0 μm or less. The width of the scribe region 140 in the X axis direction is denoted by L1 (see the interlayer dielectric film formation step S201), and the opening width of the resist 170 in the X axis direction is denoted by L2 (see the resist formation step S204). The width L3 of the protruding portion 98 may be smaller than the width L1 of the scribe region 140. The width L3 of the protruding portion 98 may be ¹⁄₁₀ or less the width L1 of the scribe region 140. The width L1 of the scribe region 140 may be 70 μm or more and 90 μm or less. The width L3 of the protruding portion 98 may be smaller than the opening width L2 of the resist 170. The width L3 of the protruding portion 98 may be ¹⁄₁₀ or less the opening width L2 of the resist 170.

In the resist formation step S204, at least a part of the resist 170 is provided farther from the active portion 160 than the protruding portion 98. That is, at least a part of the resist 170 is provided closer to the scribe region 140 than the protruding portion 98. By providing the resist 170 closer to the scribe region 140 than the protruding portion 98, the protective film 150 can be provided above the metal electrode 94 of the edge termination structure portion 90.

The protruding portion 98 has a first side wall 112 and a second side wall 114. The first side wall 112 is provided on the protective film 150 side. In FIG. 6, the first side wall 112 is in contact with the protective film 150. The first side wall 112 may be provided closer to the active portion 160 than the second side wall 114. The second side wall 114 is provided farther from the active portion 160 than the first side wall 112. The second side wall 114 is provided farther from the protective film 150 than the first side wall 112. The second side wall 114 is not in contact with the protective film 150. The second side wall 114 is provided closer to the scribe region 140 than the first side wall 112.

Figure 7:
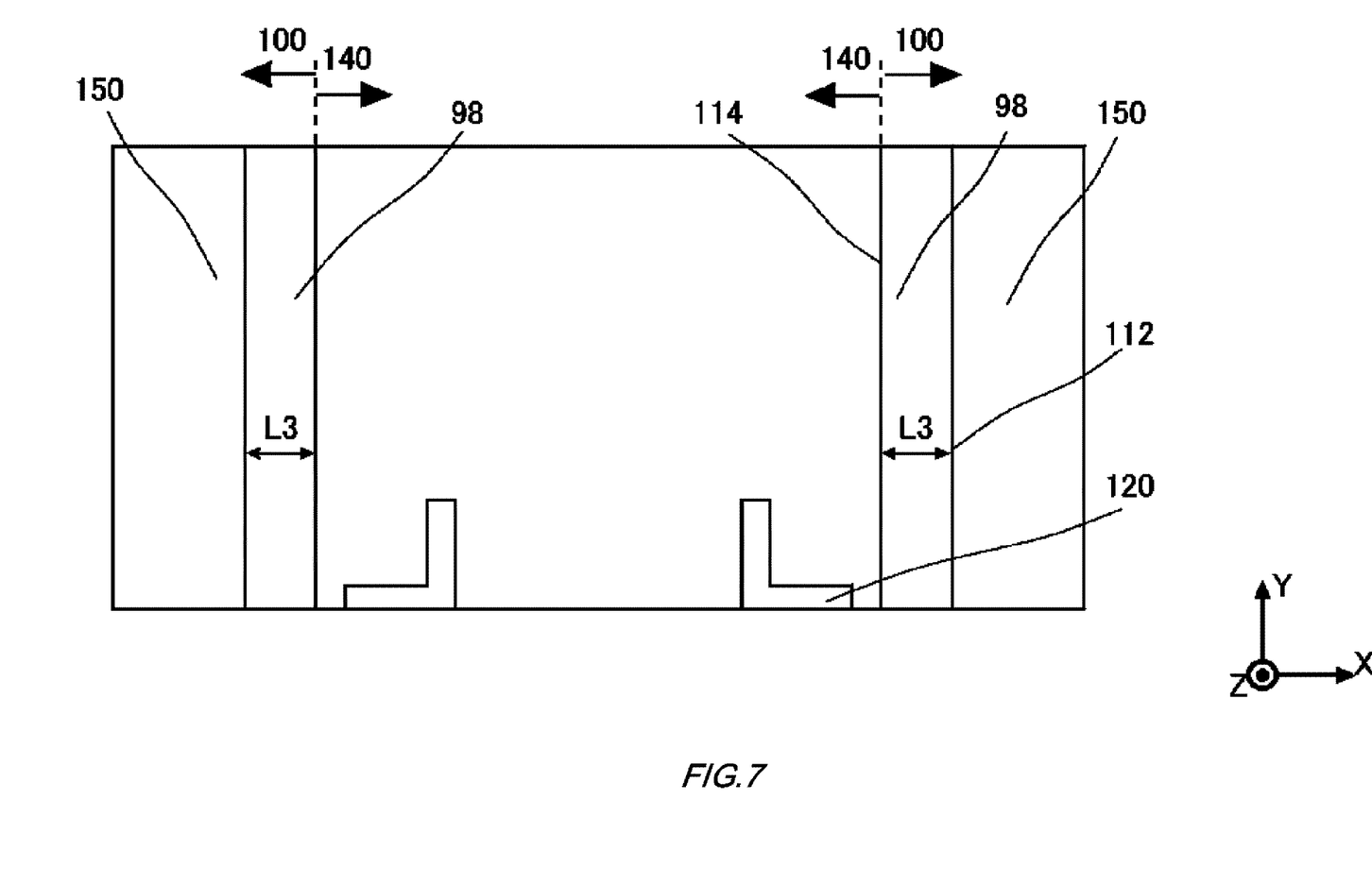
FIG. 7 is a diagram illustrating an example of a protruding portion 98 in a top view.

FIG. 7 is a diagram illustrating an example of the protruding portion 98 in a top view. The protruding portion 98 may extend in a direction in which the scribe region 140 extends in a top view. In FIG. 7, the protruding portion 98 extends in the Y axis direction. The protruding portion 98 has a long side in the Y axis direction. The protruding portion 98 may be provided along the scribe region 140. The protruding portion 98 has the width L3 in the X axis direction.

An alignment mark 120 is provided in the scribe region 140. That is, the alignment mark 120 is provided farther from the active portion 160 than the edge termination structure portion 90. The alignment mark 120 is a mark serving as a reference of alignment such as photolithography. That is, the position adjustment may be performed using the alignment mark 120. The alignment mark 120 may be formed by etching the interlayer dielectric film 38. The alignment mark 120 may be formed by providing a polysilicon film or the like above the interlayer dielectric film 38.

In the present example, the alignment mark 120 is provided farther from the active portion 160 (the semiconductor device 100 in the drawing) than the protruding portion 98. That is, the alignment mark 120 is provided closer to the scribe region 140 than the protruding portion 98. By providing the protruding portion 98, it is possible to prevent the protective film 150 from being formed above the alignment mark 120.

Since a part of the alignment mark 120 is provided in the scribe region 140, it may remain in the semiconductor device 100 after dicing. That is, a part of the alignment mark 120 may be provided in the semiconductor device 100. By controlling the dicing range, the alignment mark 120 can be left in the semiconductor device 100. The alignment mark 120 may not remain in the semiconductor device 100 after dicing.

Figure 8:
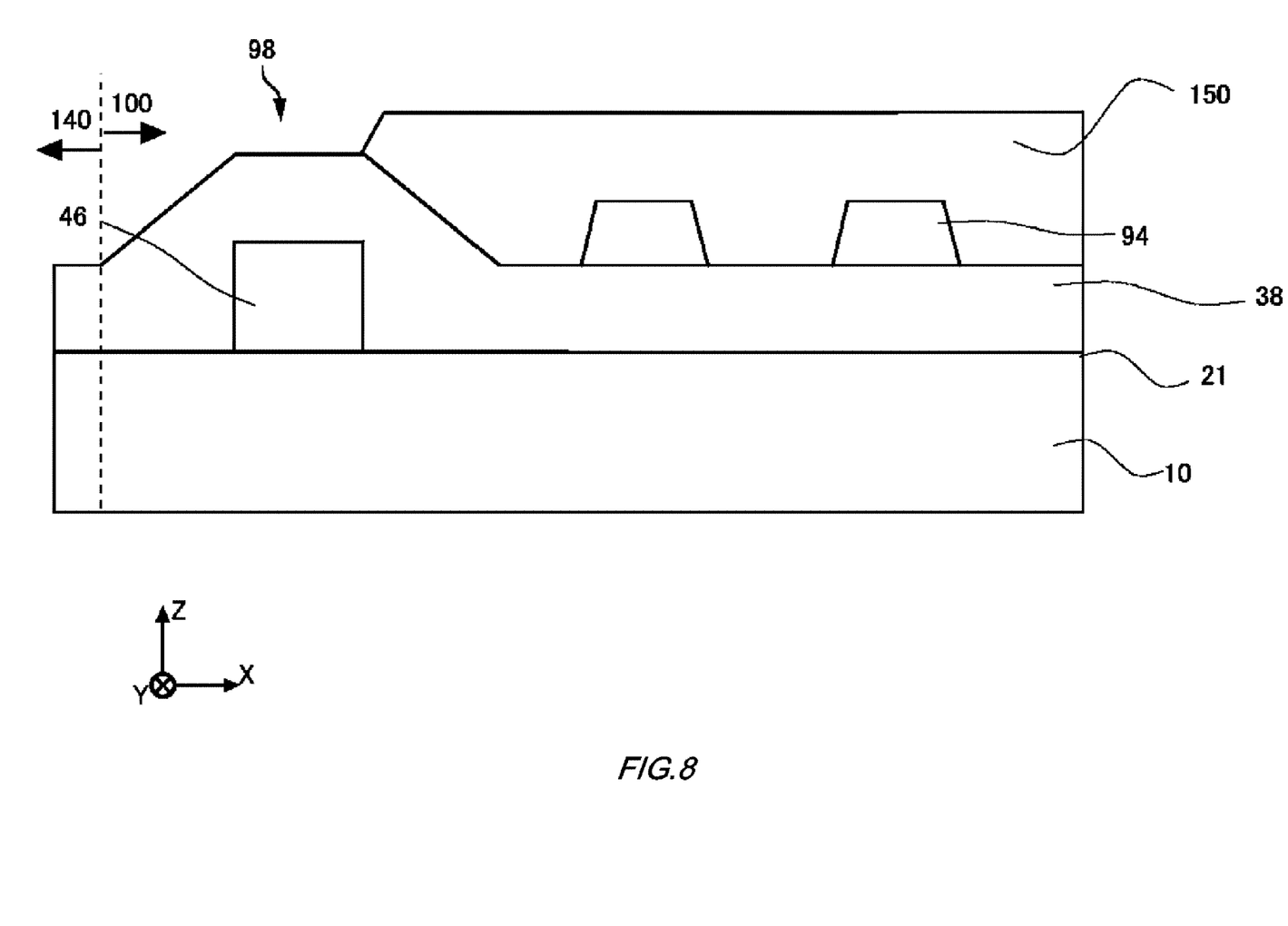
FIG. 8 is a diagram for explaining another example of the protruding portion 98.

FIG. 8 is a diagram for explaining another example of the protruding portion 98. FIG. 8 illustrates a cross section of the scribe region 140 and the semiconductor device 100. In FIG. 8, the boundary between the semiconductor device 100 and the scribe region 140 is indicated by a dotted line. In the present example, the configuration of the protruding portion 98 is different from that of the thermal treatment step S207 of FIG. 6. Other configurations of FIG. 8 may be the same as those of the thermal treatment step S207 of FIG. 6.

In the present example, the protruding portion 98 is a laminated film. In FIG. 8, the protruding portion 98 includes an interlayer dielectric film 38 (BPSG film) and polysilicon 46. By forming the polysilicon 46 in the scribe region 140, the interlayer dielectric film 38 on the polysilicon 46 can protrude. The polysilicon 46 may be made of the same material as the gate runner. Therefore, the polysilicon 46 can be disposed in the same process as the formation of the gate runner.

Figure 9:
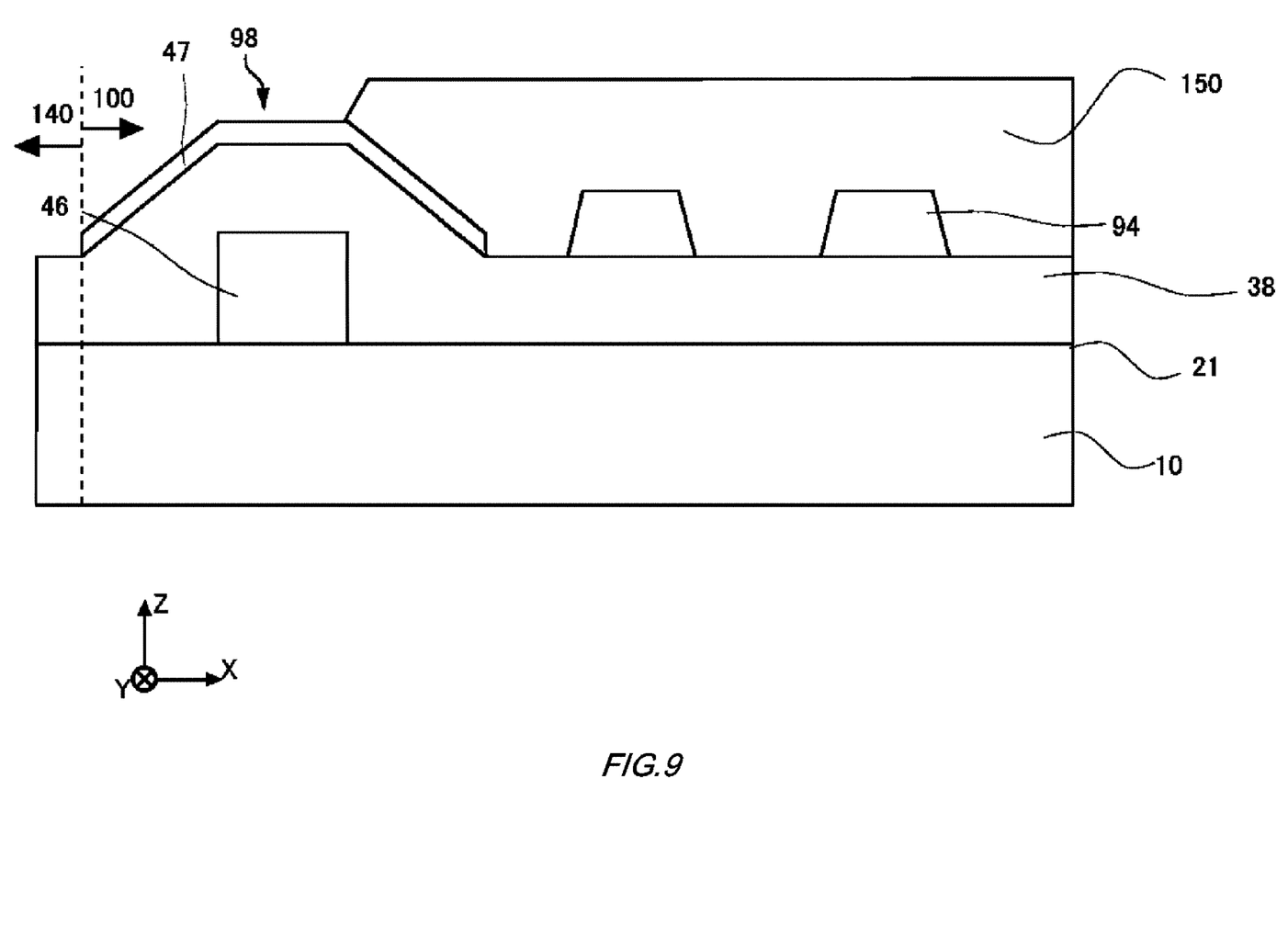
FIG. 9 is a diagram for explaining another example of the protruding portion 98.

FIG. 9 is a diagram for explaining another example of the protruding portion 98. FIG. 9 illustrates a cross section of the scribe region 140 and the semiconductor device 100. In FIG. 9, the boundary between the semiconductor device 100 and the scribe region 140 is indicated by a dotted line. In the present example, the configuration of the protruding portion 98 is different from that of the thermal treatment step S207 of FIG. 6. Other configurations of FIG. 9 may be the same as those of the thermal treatment step S207 of FIG. 6.

In the present example, the protruding portion 98 is a laminated film. In FIG. 9, the protruding portion 98 includes the interlayer dielectric film 38 (BPSG film), the polysilicon 46, and a nitride film 47. The nitride film 47 may be provided above the interlayer dielectric film 38. By providing the nitride film 47 above the interlayer dielectric film 38, the surface of the protruding portion 98 can be protected. The height of the protruding portion 98 can be increased by providing the nitride film 47 above the interlayer dielectric film 38. The nitride film 47 may be formed in the same process as the step of forming another nitride film.

Figure 10:
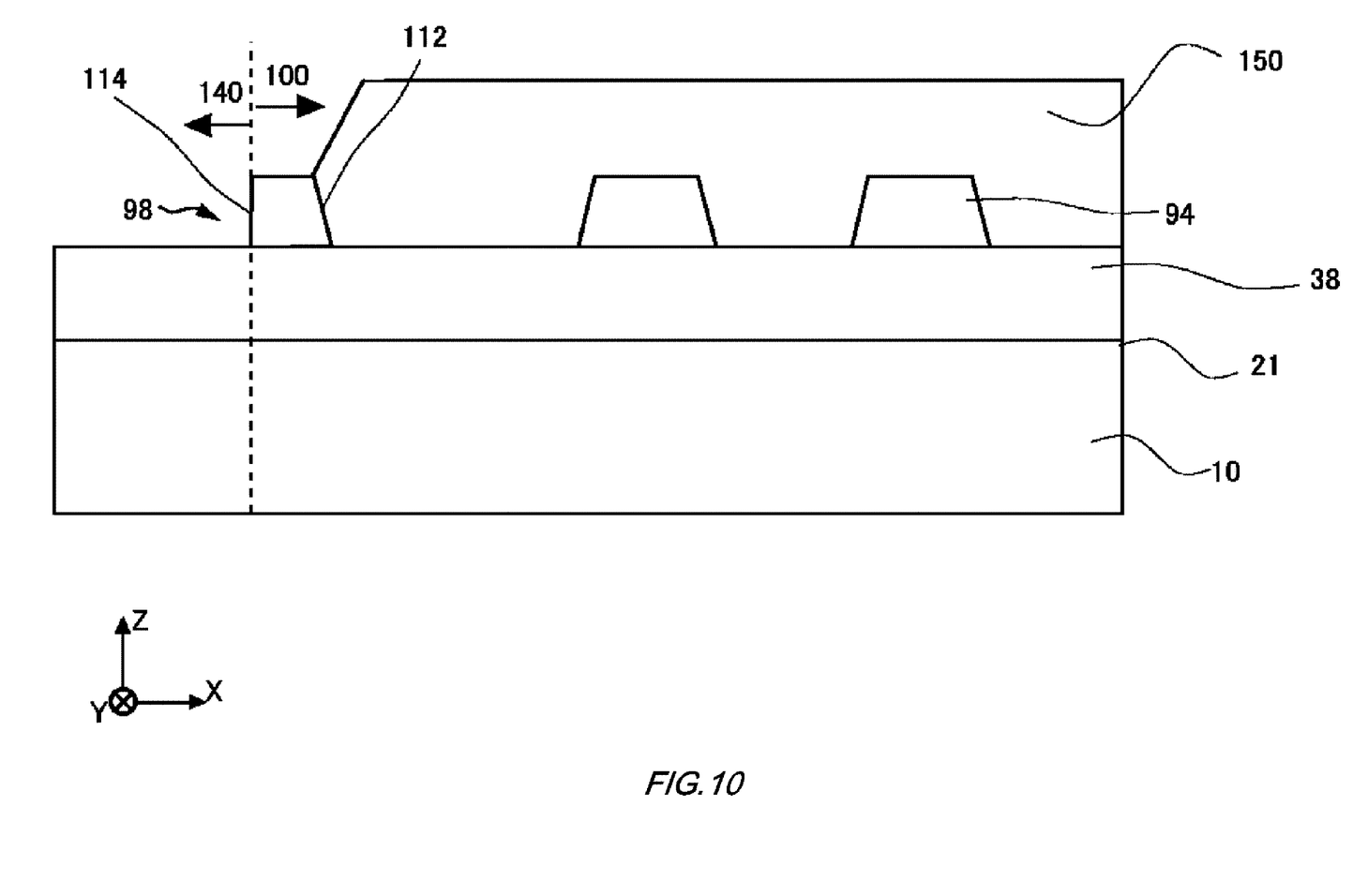
FIG. 10 is a diagram for explaining another example of the protruding portion 98.

FIG. 10 is a diagram for explaining another example of the protruding portion 98. FIG. 10 illustrates a cross section of the scribe region 140 and the semiconductor device 100. In FIG. 10, the boundary between the semiconductor device 100 and the scribe region 140 is indicated by a dotted line. In the present example, the configuration of the protruding portion 98 is different from that of the thermal treatment step S207 of FIG. 6. Other configurations of FIG. 10 may be the same as those of the thermal treatment step S207 of FIG. 6. In FIG. 10, the protruding portion 98 is a single-layer film (metal film) as in FIG. 6.

In the present example, the second side wall 114 is steeper than the first side wall 112. That is, the slope of the second side wall 114 is larger than the slope of the first side wall 112. The slope of the second side wall 114 is substantially perpendicular. By making the second side wall 114 steeper than the first side wall 112, the width of the protruding portion 98 can be narrowed. By making the slope of the first side wall 112 smaller than the slope of the second side wall 114, voids in forming the protective film 150 can be reduced.

Figure 11:
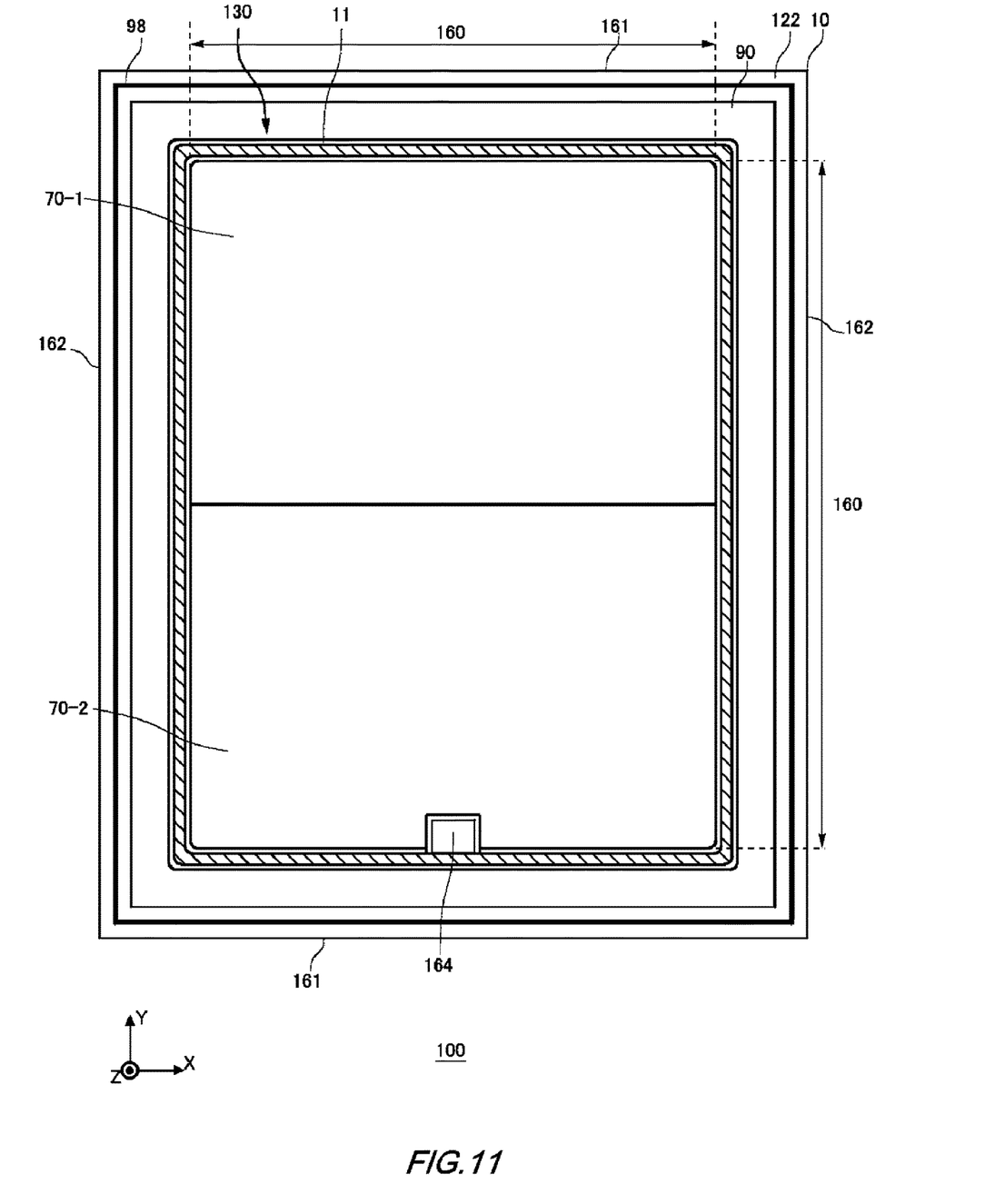
FIG. 11 is a diagram illustrating an example of the arrangement of the protruding portion 98 in the semiconductor device 100.

FIG. 11 is a diagram illustrating an example of the arrangement of the protruding portion 98 in the semiconductor device 100. FIG. 11 is a top view illustrating an exemplary embodiment of the semiconductor device 100. In FIG. 11, the protruding portion 98 is indicated by a thick line.

The semiconductor device 100 of the present example includes an outer circumferential region 122 between the edge termination structure portion 90 and the first end side 161 or the second end side 162 in a top view. The outer circumferential region 122 surrounds the edge termination structure portion 90. In FIG. 11, the protruding portion 98 is provided in the outer circumferential region 122. The protruding portion 98 may be provided in the edge termination structure portion 90. The boundary between the outer circumferential region 122 and the edge termination structure portion 90 is, for example, an end portion of a field plate or an end portion of a guard ring provided closest to the first end side 161 or the second end side 162.

In FIG. 11, the protruding portion 98 is provided between the edge termination structure portion 90 and the first end side 161 or the second end side 162. That is, the protruding portion 98 is provided so as to surround the edge termination structure portion 90. In the example of FIG. 11, the protruding portion 98 is continuously provided along the first end side 161 and the second end side 162, but may not be partially provided. For example, the protruding portion 98 may not be provided near the corner connecting the first end side 161 and the second end side 162.

Figure 12:
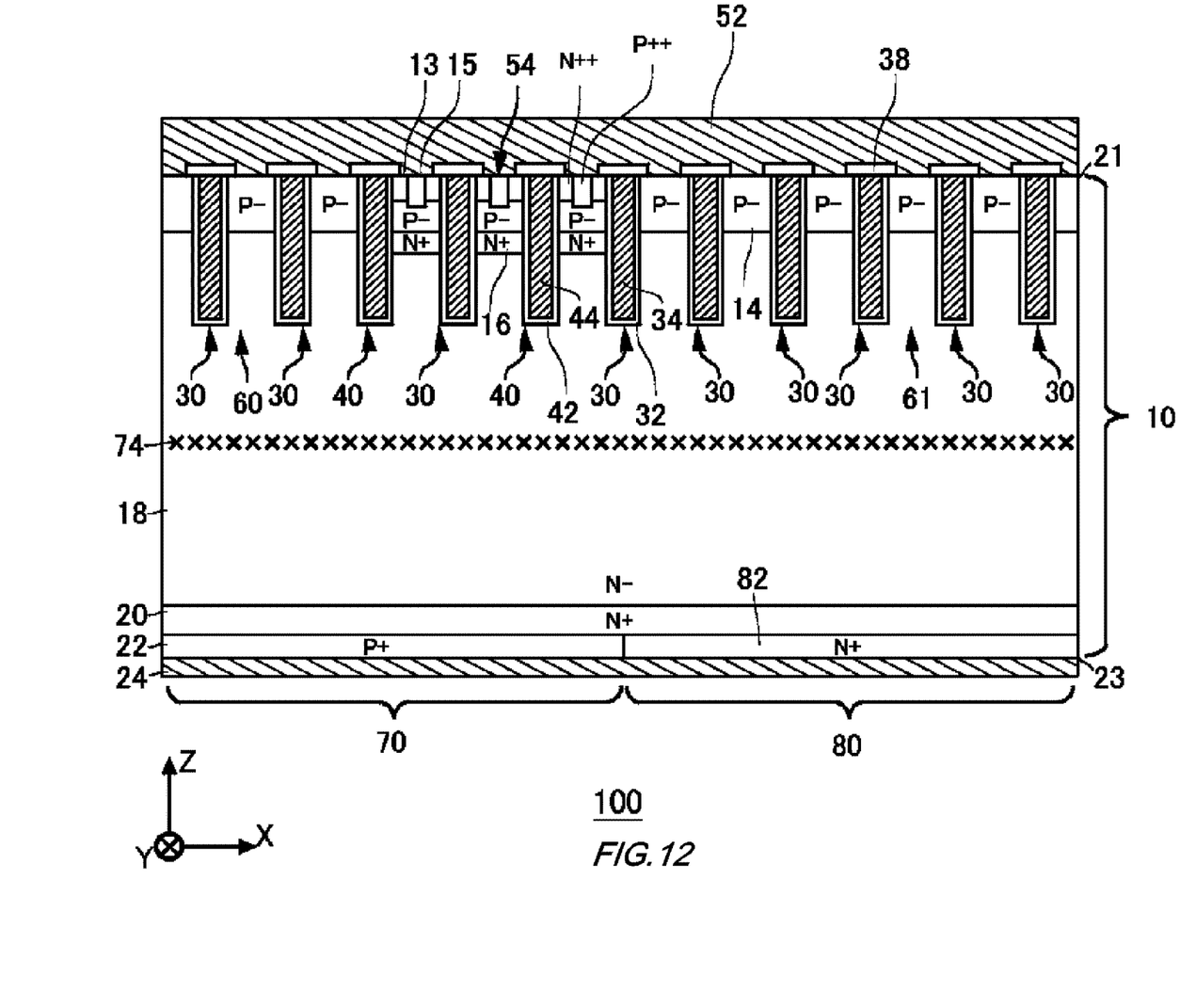
FIG. 12 is a diagram illustrating an example of a cross section of the semiconductor device 100 in an active portion 160.

FIG. 12 is a diagram illustrating an example of a cross section of the semiconductor device 100 in the active portion 160. This cross section is an XZ plane passing through an emitter region 13 and a cathode region 82. The semiconductor device 100 of the present example includes the semiconductor substrate 10, the interlayer dielectric film 38, an emitter electrode 52, and a collector electrode 24 in the cross section. In the present example, the transistor portion 70 and a diode portion 80 are disposed on the semiconductor substrate 10.

The transistor portion 70 has a P+ type collector region 22 in a region in contact with the lower surface of the semiconductor substrate 10. In the transistor portion 70, a gate structure including an N++ type emitter region 13, a P− type base region 14, a P++ type contact region 15, a gate conductive portion, and a gate dielectric film is periodically disposed on the upper surface side of the semiconductor substrate 10.

The diode portion 80 has an N+ type cathode region 82 in a region in contact with the lower surface of the semiconductor substrate 10. In the present specification, a region in which the cathode region is provided is referred to as a diode portion 80. That is, the diode portion 80 is a region overlapping the cathode region in a top view. On the lower surface of the semiconductor substrate 10, a P+ type collector region 22 may be provided in a region other than the cathode region.

In FIG. 12, the interlayer dielectric film 38 is provided on the upper surface 21 of the semiconductor substrate 10. The interlayer dielectric film 38 is provided with a contact hole 54.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided in the lower surface 23 of the semiconductor substrate 10. The collector electrode 24 is formed of a metal material such as aluminum.

Each of the transistor portion 70 and the diode portion 80 has a plurality of trench portions arranged in the arrangement direction (the X axis direction in the present example). In the transistor portion 70 of the present example, one or more gate trench portions 40 and one or more dummy trench portions 30 are periodically provided along the arrangement direction. In the diode portion 80 of the present example, a plurality of dummy trench portions 30 is provided along the arrangement direction. The diode portion 80 of the present example is not provided with the gate trench portion 40.

A mesa portion is provided between the trench portions in the arrangement direction. The mesa portion refers to a region sandwiched between the trench portions inside the semiconductor substrate 10. As an example, the upper end of the mesa portion is the upper surface 21 of the semiconductor substrate 10. The depth position of the lower end of the mesa portion is the same as the depth position of the lower end of the trench portion. The mesa portion of the present example is provided to extend in the extending direction (Y axis direction) along the trench in the upper surface of the semiconductor substrate 10. In the present example, the transistor portion 70 is provided with a mesa portion 60, and the diode portion 80 is provided with a mesa portion 61. In the case of simply referring to as a mesa portion in the present specification, the mesa portion refers to each of the mesa portion 60 and the mesa portion 61.

The base region 14 is provided in each mesa portion. The mesa portion 60 of the transistor portion 70 has the emitter region 13 exposed to the upper surface 21 of the semiconductor substrate 10. The emitter region 13 is provided in contact with the gate trench portion 40. The mesa portion 60 in contact with the gate trench portion 40 may be provided with the contact region 15 exposed to the upper surface 21 of the semiconductor substrate 10.

As an example, the contact region and the emitter region 13 of the mesa portion 60 are provided in a stripe shape along the extending direction (Y axis direction) of the trench portion. That is, the emitter region 13 is provided in a region in contact with the trench portion, and the contact region 15 is provided in a region sandwiched by the emitter region 13.

In another example, each of the contact region 15 and the emitter region 13 in the mesa portion 60 is provided from one trench portion to the other trench portion in the X axis direction. In this case, the contact regions 15 and the emitter regions 13 of the mesa portion 60 may be alternately disposed along the extending direction (Y axis direction) of the trench portion.

The emitter region 13 is not provided in the mesa portion 61 of the diode portion 80. The base region 14 and the contact region 15 may be provided in the upper surface of the mesa portion 61.

An accumulation region 16 is provided below the base region 14. The accumulation region 16 is an N+ type region having a higher doping concentration than a drift region 18. By providing the high-concentration accumulation region 16 between the drift region 18 and the base region 14, a carrier injection enhancement effect (IE effect) can be enhanced, and the ON voltage can be reduced. The accumulation region 16 may be provided so as to cover the entire lower surface of the base region 14 in each mesa portion 60. The accumulation region 16 may be provided only in the transistor portion 70.

In each of the transistor portion 70 and the diode portion 80, an N+ type buffer region 20 is provided on the lower surface 23 side of the drift region 18. The buffer region 20 may function as a field stop layer that prevents a depletion layer spreading from the lower end of the base region 14 from reaching the P+ type collector region 22 and the N+ type cathode region 82.

In the transistor portion 70, the P+ type collector region 22 is provided below the buffer region 20. The acceptor concentration of the collector region 22 is higher than the acceptor concentration of the base region 14. The collector region 22 may contain the same acceptor as the base region 14, and may contain a different acceptor. The acceptor of the collector region 22 is, for example, boron.

In the diode portion 80, the N+ type cathode region 82 is provided below the buffer region 20. The donor of the cathode region 82 is, for example, hydrogen or phosphorus. Elements to be donors and acceptors in each region are not limited to the examples described above.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the drift region 18. The trench portion penetrating the doping region is not limited to those manufactured in the order of forming the doping region and then forming the trench portion. The doping region formed between the trench portions after forming the trench portions is also included in a doping region in which the trench portion penetrates.

The gate trench portion 40 includes a gate trench, a gate dielectric film 42, and a gate conductive portion 44 provided in the upper surface 21 of the semiconductor substrate 10. The gate dielectric film 42 is provided to cover the inner wall of the gate trench. The gate dielectric film 42 may be formed by oxidizing or nitriding the semiconductor of the inner wall of the gate trench. The gate conductive portion 44 is provided on the inner side of the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 in the upper surface 21 of the semiconductor substrate 10. The gate conductive portion 44 is electrically connected to the gate runner. The gate conductive portion 44 may be connected to the gate pad 164. If a predetermined gate voltage is applied to the gate conductive portion 44, a channel by an inversion layer of electrons is formed in a surface layer of the interface in contact with the gate trench portion 40 in the base region 14.

The dummy trench portion 30 may have the same structure as the gate trench portion 40 in the cross section. The dummy trench portion 30 includes a dummy trench provided in the upper surface 21 of the semiconductor substrate 10, a dummy dielectric film 32, and a dummy conductive portion 34. The dummy conductive portion 34 may be connected to an electrode different from the gate pad 164. For example, the dummy conductive portion 34 may be connected to a dummy pad (not illustrated) connected to an external circuit different from the gate pad 164, and control different from that of the gate conductive portion 44 may be performed. The dummy conductive portion 34 may be electrically connected to the emitter electrode 52. The dummy dielectric film 32 is provided to cover the inner wall of the dummy trench. The dummy conductive portion 34 is provided inside the dummy trench and is provided on the inner side of the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of the present example are covered with the interlayer dielectric film 38 on the upper surface 21 of the semiconductor substrate 10. Note that the bottom portions of the dummy trench portion 30 and the gate trench portion 40 may be a curved surface shape protruding downward (a curved shape in a cross section).

A lifetime control portion 74 is a region in which a lifetime killer is intentionally formed by, for example, implanting impurities into the semiconductor substrate. The lifetime killer is a carrier recombination center and may be a crystal defect, and may be a vacancy, a divacancy, a complex defect of these and an element constituting the semiconductor substrate 10, a dislocation, a rare gas element such as helium or neon, a metal element such as platinum, or the like. The lifetime control portion 74 can be formed by injecting helium or the like into the semiconductor substrate 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
    a semiconductor substrate provided with an active portion and an edge termination structure portion surrounding the active portion in a top view;
    an interlayer dielectric film provided above the semiconductor substrate;
    a protective film provided above the interlayer dielectric film; and
    a protruding portion provided farther from the active portion than the edge termination structure portion and protruding further than the interlayer dielectric film, wherein the protruding portion is not covered with the protective film, and the protective film is provided closer to the active portion than the protruding portion.

2. The semiconductor device according to claim 1, wherein the protruding portion is a single-layer film.

3. The semiconductor device according to claim 2, wherein the protruding portion is a metal film.

4. The semiconductor device according to claim 1, wherein the protruding portion is a laminated film.

5. The semiconductor device according to claim 4, wherein the protruding portion includes a polysilicon film and a BPSG film.

6. The semiconductor device according to claim 5, wherein the protruding portion further includes a nitride film.

7. The semiconductor device according to claim 1, wherein a width of the protruding portion is 4.5 μm or more and 6.0 μm or less.

8. The semiconductor device according to claim 2, wherein a width of the protruding portion is 4.5 μm or more and 6.0 μm or less.

9. The semiconductor device according to claim 3, wherein a width of the protruding portion is 4.5 μm or more and 6.0 μm or less.

10. The semiconductor device according to claim 1, wherein the protruding portion is provided at a position lower than an upper end of the protective film in a height direction.

11. The semiconductor device according to claim 2, wherein the protruding portion is provided at a position lower than an upper end of the protective film in a height direction.

12. The semiconductor device according to claim 3, wherein the protruding portion is provided at a position lower than an upper end of the protective film in a height direction.

13. The semiconductor device according to claim 1, further comprising:

an alignment mark provided farther from the active portion than the edge termination structure portion, wherein the alignment mark is provided farther from the active portion than the protruding portion.

14. The semiconductor device according to claim 2, further comprising:

an alignment mark provided farther from the active portion than the edge termination structure portion, wherein the alignment mark is provided farther from the active portion than the protruding portion.

15. The semiconductor device according to claim 3, further comprising:

an alignment mark provided farther from the active portion than the edge termination structure portion, wherein the alignment mark is provided farther from the active portion than the protruding portion.

16. The semiconductor device according to claim 1, wherein the protruding portion includes:

a first side wall on the protective film side; and a second side wall provided farther from the active portion than the first side wall, and the second side wall is steeper than the first side wall.

17. The semiconductor device according to claim 2, wherein the protruding portion includes:

a first side wall on the protective film side; and a second side wall provided farther from the active portion than the first side wall, and the second side wall is steeper than the first side wall.

18. The semiconductor device according to claim 3, wherein the protruding portion includes:

a first side wall on the protective film side; and a second side wall provided farther from the active portion than the first side wall, and the second side wall is steeper than the first side wall.

19. A method of manufacturing a semiconductor device including a semiconductor substrate provided with an active portion and an edge termination structure portion surrounding the active portion, the method comprising:

forming an interlayer dielectric film above the semiconductor substrate;

forming a protruding portion provided farther from the active portion than the edge termination structure portion and protruding further than the interlayer dielectric film;

forming a protective film above the interlayer dielectric film; and patterning the protective film, wherein in the patterning of the protective film, the protruding portion is not covered with the protective film, and the protective film is provided closer to the active portion than the protruding portion.

20. The method of manufacturing a semiconductor device according to claim 19, further comprising:

forming a resist used in the patterning of the protective film above the protective film, wherein at least a part of the resist is provided farther from the active portion than the protruding portion.

* * * * *